(12) United States Patent
Lee et al.

(10) Patent No.: US 11,216,326 B2
(45) Date of Patent: Jan. 4, 2022

(54) MEMORY SYSTEM AND OPERATION METHOD THEREOF

(71) Applicant: SK hynix Inc., Gyeonggi-do (KR)

(72) Inventors: Jun-Seo Lee, Chungcheongbuk-do (KR); Nam-Yul Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 172 days.

(21) Appl. No.: 16/578,626

(22) Filed: Sep. 23, 2019

(65) Prior Publication Data

US 2020/0167216 A1 May 28, 2020

(30) Foreign Application Priority Data

Nov. 22, 2018 (KR) ........................ 10-2018-0145537

(51) Int. Cl.
| | | |
|---|---|---|
| *G06F 11/07* | (2006.01) | |
| *G06F 11/30* | (2006.01) | |
| *G06F 13/16* | (2006.01) | |
| *G11C 29/00* | (2006.01) | |
| *G11C 11/408* | (2006.01) | |

(Continued)

(52) U.S. Cl.
CPC ........ *G06F 11/076* (2013.01); *G06F 11/3037* (2013.01); *G06F 12/0238* (2013.01); *G06F 13/1668* (2013.01); *G11C 11/408* (2013.01); *G11C 11/409* (2013.01); *G11C 29/76* (2013.01)

(58) Field of Classification Search
CPC ............... G06F 11/076; G06F 11/3037; G06F 13/1668; G06F 12/0238; G06F 11/3471; G06F 2201/88; G06F 2201/81; G06F 2212/1032; G06F 2212/7206; G06F 2212/502; G06F 2212/7204; G06F 2212/7201; G06F 2212/7208; G06F 12/0284; G06F 3/0619; G06F 3/0644; G06F 3/0658; G06F 3/0683; G11C 29/76;
(Continued)

(56) References Cited

U.S. PATENT DOCUMENTS 10,664,392 B2 * 5/2020 Xu ...................... G06F 12/0646
2013/0097362 A1 * 4/2013 Tan ..................... G06F 12/0246
711/103

(Continued)

FOREIGN PATENT DOCUMENTS

FR          002733332 B1 * 10/2002 ............. G11C 29/80
KR     10-2013-0115066      10/2013

*Primary Examiner* — Fernando Hidalgo
(74) *Attorney, Agent, or Firm* — IP & T Group LLP (57) ABSTRACT

A memory system may include: one or more normal memory regions; one or more spare memory regions; and a controller suitable for controlling the normal memory regions and the spare memory regions. The controller may determine, among the normal memory regions, a first normal cell region that includes a concentrated cell region whose access count exceeds a first threshold and neighboring cell regions in a set range from the concentrated cell region perform first address mapping to map an address of the first normal cell region to an address of a first spare cell region in the spare memory regions, and perform second address mapping to map the address of the first spare cell region to an address of a second normal cell region in the normal memory regions, when an access count of the first spare cell region exceeds a second threshold.

18 Claims, 10 Drawing Sheets

(51) Int. Cl.
*G11C 11/409* (2006.01)
*G06F 12/02* (2006.01)

(58) Field of Classification Search
CPC ....... G11C 11/408; G11C 11/409; G11C 7/24; G11C 7/02; G11C 8/12; Y02D 10/00
USPC ........................................................ 714/47.2
See application file for complete search history.

(56) References Cited

U.S. PATENT DOCUMENTS

| | | | |
|---|---|---|---|
| 2016/0139833 A1* | 5/2016 | Chang | G11C 11/4076 711/105 |
| 2017/0123879 A1 | 5/2017 | Donlin | |
| 2017/0228163 A1* | 8/2017 | Kraemer | G06F 3/061 |
| 2019/0188101 A1* | 6/2019 | Kim | G11C 29/72 |

* cited by examiner

MEMORY SYSTEM AND OPERATION METHOD THEREOF

CROSS-REFERENCE TO RELATED APPLICATION

This application claims priority under 35 U.S.C. § 119 to Korean Patent Application No. 10-2018-0145537, filed on Nov. 22, 2018, which is incorporated herein by reference in its entirety.

BACKGROUND

1. Field

Various embodiments relate to a memory system, and more particularly, to a memory system including a memory device, and an operation method thereof.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption.

When a memory cell is continuously accessed, memory cells adjacent to the corresponding memory cell may be consistently affected by an electromagnetic field. In this case, data stored in the memory cells may be distorted. Such a phenomenon is referred to as row hammering.

SUMMARY

Various embodiments are directed to a method capable of preventing data distortion caused by row hammering while maintaining the performance of a memory system, and the memory system.

In an embodiment, a memory system may include: one or more normal memory regions; one or more spare memory regions; and a controller suitable for controlling the normal memory regions and the spare memory regions. The controller may determine, among the normal memory regions, as a first normal cell region that includes a concentrated cell region whose access count exceeds a first threshold and neighboring cell regions in a set range from the concentrated cell region, perform first address mapping to map an address of the first normal cell region to an address of a first spare cell region in the spare memory regions, and perform second address mapping to map the address of the first spare cell region to an address of a second normal cell region in the normal memory regions, when an access count of the first spare cell region exceeds a second threshold.

In an embodiment, there is provided an operating method of a memory system which includes one or more normal memory regions and one or more spare memory regions. The operating method may include: determining, among the normal memory regions, a first normal cell region that includes a concentrated cell region whose access count exceeds a first threshold and neighboring cell regions in a set range from the concentrated cell region; performing first address mapping to map an address of the first normal cell region to an address of a first spare cell region in the spare memory regions; and performing second address mapping to map the address of the first spare cell region to an address of a second normal cell region in the normal memory regions, when an access count of the first spare cell region exceeds a second threshold.

DETAILED DESCRIPTION

Various embodiments are described in detail below with reference to the accompanying drawings. The following description focuses on features and aspects of the present invention, while well-known technical material is omitted so as not to unnecessarily obscure that description. Throughout the specification, reference to "an embodiment" or the like is not necessarily to only one embodiment, and different references to any such phrase are not necessarily to the same embodiment(s).

Figure 1:
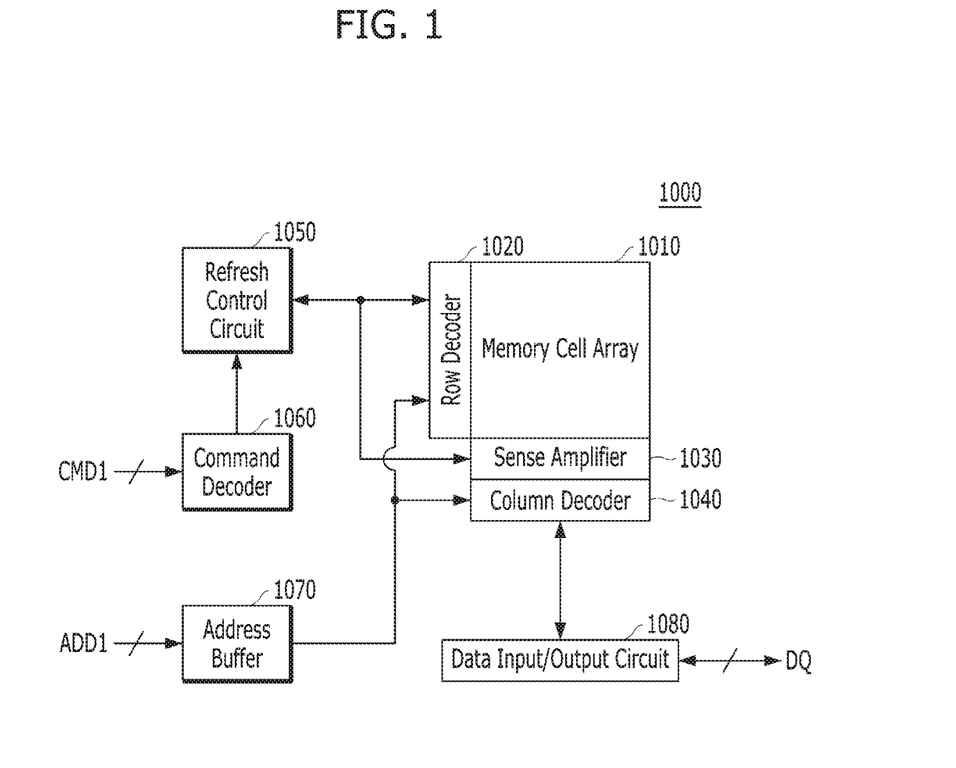
FIG. 1 is a block diagram illustrating a memory device including a memory cell array.

FIG. 1 is a block diagram illustrating a memory device 1000 including a memory cell array 1010. Features and aspects of the present invention are described in the context in which the memory device 1000 is a dynamic random access memory (DRAM), although the present invention is not limited to that type of memory.

Referring to FIG. 1, the memory device 1000 may include the memory cell array 1010, a row decoder 1020, a sense amplifier 1030, a column decoder 1040, a refresh control circuit 1050, a command decoder 1060, an address buffer 1070 and a data input and output (input/output) circuit 1080.

The memory cell array 1010 may include a plurality of memory cells arranged in row and column directions. In this specification, memory cells arranged in one row direction may be defined as a row.

The plurality of memory cells may include not only main cells used for storing data, but also redundancy cells for replacing memory cells in which an error has occurred. The redundancy cells may have the same structure as the main cells, and a redundancy cell array including the redundancy cells may be used as the extra memory region of the memory device 1000.

The command decoder 1060 may receive a command CMD1 from a controller (not shown), and internally generate control signals by decoding the command CMD1. The control signals may include an active signal, read signal, write signal and refresh signal. The refresh control circuit 1050 may receive the refresh signal from the command decoder 1060, and output a row address to the row decoder 1020 in order to refresh one word line of the memory cell array 1010.

The controller may transmit an address ADD1 with the command CMD1 to the memory device 1000. The address ADD1 may designate a memory cell to which data is to be written or from which data is to be read. The address buffer 1070 may receive the address ADD1 from the controller and generate row/column addresses.

The row decoder 1020 may decode the row address which is outputted from the refresh control circuit 1050 or the address buffer 1070 in order to designate one word line of the memory cell array 1010. During a write operation, the row decoder 1020 may decode the row address outputted from the address buffer 1070 and enable a word line coupled to a memory cell to which data is to be written. During a read operation, the row decoder 1020 may decode the row address outputted from the address buffer 1070 and enable a word line coupled to a memory cell from which data is to be read. Furthermore, the row decoder 1020 may refresh the word line corresponding to the row address outputted from the refresh control circuit 1050.

The sense amplifier 1030 may sense and amplify data of the memory cell coupled to the word line designated by the row decoder 1020, and store the data of the memory cell. The column decoder 1040 may decode the column address outputted from the address buffer 1070, in order to designate one or more bit lines coupled to one or more memory cells to or from which data is to be inputted or outputted.

The data input/output circuit 1080 may output data received from the memory cell in the memory cell array 1010 through the sense amplifier 1030, or input data to the corresponding memory cell. As a result, the data inputted through the data input/output circuit 1080 may be written to the memory cell array 1010 based on the address ADD1, or the data read from the memory cell array 1010 based on the address ADD1 may be outputted to the controller through the data input/output circuit 1080.

When the row decoder 1020 applies a voltage to a word line coupled to a certain memory cell in order to access the corresponding memory cell, an electromagnetic field may be formed around the corresponding word line. When the corresponding memory cell is frequently accessed, data stored in neighboring memory cells may be distorted while the neighboring memory cells are continuously affected by the electromagnetic field. That is, row hammering may occur.

In order to prevent data loss in the memory system due to row hammering, memory cells adjacent to a certain memory cell may be refreshed at a high frequency, when the corresponding memory cell is frequently accessed. However, frequent refresh operations may be a factor in degrading the performance of the memory system. That is, since a voltage needs to be applied to a word line coupled to the adjacent memory cells in order to perform the refresh, the adjacent memory cells cannot be accessed while the refresh is performed.

The memory system and the operating method thereof in accordance with an embodiment can prevent data loss caused by row hammering while maintaining the performance of the memory system.

Figure 2:
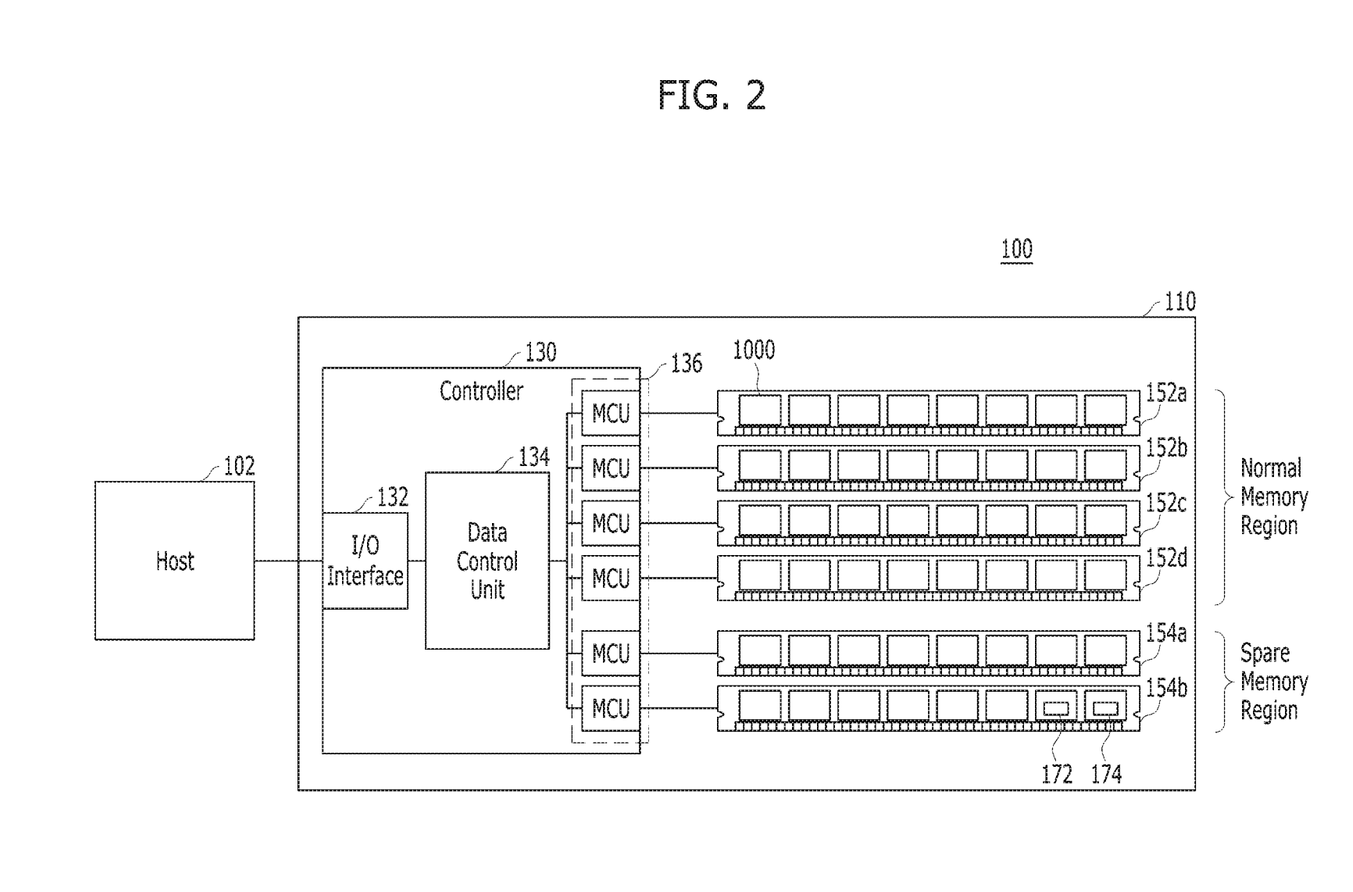
FIG. 2 illustrates a structure of a data processing system including a memory system in accordance with an embodiment of the present invention.

FIG. 2 is a block diagram illustrating a data processing system 100 in accordance with an embodiment of the present invention.

Referring to FIG. 2, the data processing system 100 may include a host 102 operatively coupled to a memory system 110.

The host 102 may include one or more processing elements. The host 102 may transfer a command to the memory system 110. The memory system 110 may operate in response to the command of the host 102. In particular, the memory system 110 may store data accessed by the host 102. The memory system 110 may be used as a main memory device or auxiliary memory device of the host 102.

The memory system 110 may include a controller 130, one or more normal memory regions and one or more spare memory regions. By way of example, FIG. 2 illustrates the memory system 110 including four normal memory regions 152a to 152d and two spare memory regions 154a and 154b. Each of the normal memory regions 152a to 152d and the spare memory regions 154a and 154b may store or write data and output or read data stored therein, under control of the controller 130.

In an embodiment, each of the normal memory regions 152a to 152d and the spare memory regions 154a and 154b may be a memory module, for example, a dual in-line memory module (DIMM). For example, each of the memory regions 152a to 152d, 154a and 154b may be an unbuffered dual in-line memory module (UDIMM), a registered dual in-line memory module (RDIMM), a load reduced dual in-line memory module (LRDIMM), a fully buffered dual in-line memory module (FBDIMM) or the like.

When each of the memory regions 152a to 152d, 154a and 154b is a memory module, the memory region may include one or more memory devices 1000. The memory devices 1000 may have the same or different characteristics. In various embodiments, the normal memory regions 152a to 152d and the spare memory regions 154a and 154b may include memory devices 1000 having different characteristics in terms of storage capacity or latency. That is, one memory region may be a convergence memory device in which a plurality of memory devices such as a dynamic random access memory (DRAM), phase change random access memory (PCRAM), magnetic random access memory (MRAM), spin transfer torque magnetic random access memory (STT-RAM) and flash memory are converged.

The present invention is not limited to the case in which each of the memory regions 152a to 152d, 154a and 154b is a memory module. In an embodiment, each of the memory regions 152a to 152d, 154a and 154b may be the memory device 1000. For example, the memory system 110 may include a plurality of memory modules, and each of the memory modules may include one or more normal memory regions and one or more spare memory regions.

In an embodiment, at least any one of the normal memory regions 152a to 152d and the spare memory regions 154a and 154b may include an access count memory 172 and a mapping table 174. FIG. 2 illustrates an example in which the access count memory 172 and the mapping table 174 are included in the spare memory region 154b. The access count memory 172 and the mapping table 174 are described below with reference to FIG. 3.

The controller 130 may include a data control unit 134, a plurality of memory control units (MCUs) 136 and an input and output (I/O) interface 132.

The data control unit 134 may control overall operations of the memory system 110. For example, the data control unit 134 may control a write operation of writing write data provided from the host 102 to the memory regions in response to a write command. For another example, the data control unit 134 may control a read operation of reading data stored in the memory regions and providing the read data to the host 102, in response to a read command.

The memory control units 136 may support interfacing between the data control unit 134 and the memory regions. The memory control units 136 may correspond to the normal memory regions 152a to 152d and the spare memory regions 154a and 154b, respectively.

The I/O interface 132 may support interfacing between the data control unit 134 and the host 102. At this time, the host 102 and the I/O interface 132 may be connected through an interconnect board (e.g., an interconnect board 300 which will be described below with reference to FIG. 10). The I/O interface 132 may output data transferred from the data control unit 134 to the host 102, and input data received from the host 102 to the data control unit 134, using protocols related to one or more wired/wireless communication techniques. For example, the I/O interface 132 may support communication between the data control unit 134 and the host 102 according to protocols such as Peripheral Component Interconnect Express (PCIe), QuickPath Interconnect (QPI) and Ethernet. Furthermore, the I/O interface 132 may support communication between the data control unit 134 and the host 102 according to interface specifications such as Cache Coherent Interconnect for accelerators (CCIX) and GEN-Z.

In accordance with various embodiments, the controller 130 may detect a concentrated cell region whose access count exceeds a first (1st) threshold, among the normal memory regions 152a to 152d. The controller 130 may determine memory cell regions within a set range, e.g., distance, from the concentrated cell region as neighboring cell regions. The controller 130 may determine a memory region including the concentrated cell region and the neighboring cell regions as a first normal cell region. Then, the controller 130 may perform first address mapping to map an address of the first normal cell region to an address of a first spare cell region of the spare memory regions 154a and 154b.

After the first address mapping, the controller 130 may perform second (2nd) address mapping to map the address of the first spare cell region to an address of a second normal memory cell region of the normal memory regions 152a to 152d, when the access count of the first spare cell region exceeds a second threshold.

Figure 3:
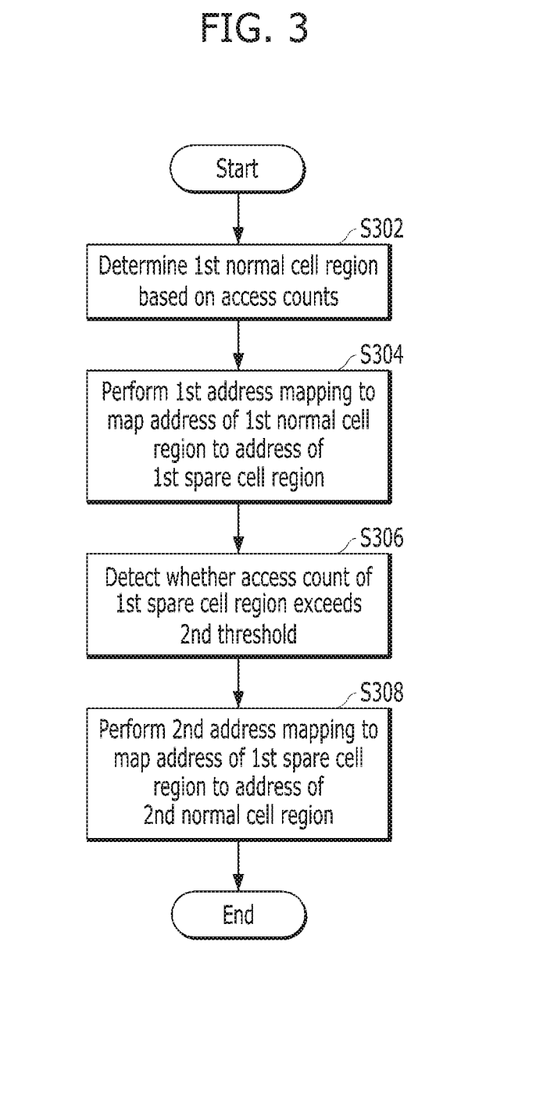
FIGS. 3 and 4 are flowcharts illustrating an operation of a memory system in accordance with an embodiment of the present invention.
Figure 4:
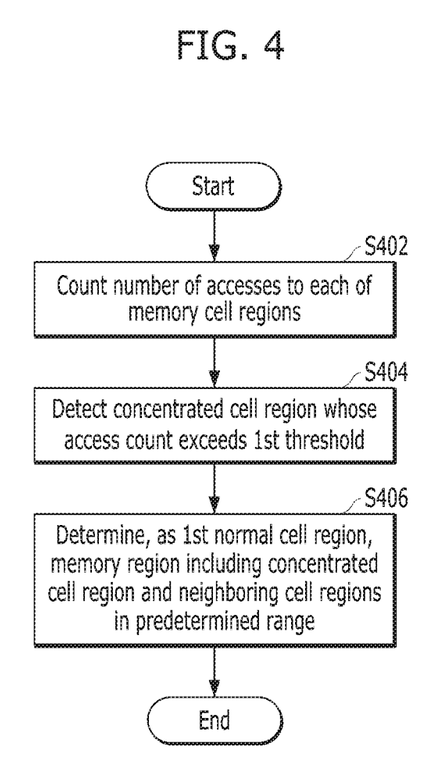

FIGS. 3 and 4 are flowcharts illustrating an operation of the memory system 110 in accordance with an embodiment.

Referring to FIG. 3, the controller 130 may determine the first (1st) normal cell region based on the respective access counts of the normal memory regions 152a to 152d in step S302.

Step S302 may include steps S402 to S406 as shown in FIG. 4.

Referring to FIG. 4, the controller 130 may count the number of accesses to each of the memory cell regions included in the normal memory regions 152a to 152d in step S402. For example, the controller 130 may count the number of accesses to each of rows included in the normal memory regions 152a to 152d.

In step S404, the controller 130 may detect a concentrated cell region whose access count exceeds the first threshold.

In an embodiment, the first threshold may be different for each of the normal memory regions 152a to 152d. For example, the first threshold may be changed depending on the type of memories constituting each of the normal memory regions 152a to 152d.

In an embodiment, the controller 130 may perform the operation of step S404 in a set period, for example, whenever refresh is performed.

In step S406, the controller 130 may determine, as the first normal cell region, a memory region including the concentrated cell region and neighboring cell regions within a set range, e.g., distance, from the concentrated cell region.

Specifically, the controller 130 may determine, as the neighboring cell regions, memory cell regions corresponding to rows in a set range around, e.g., next to, a row corresponding to the concentrated cell region. The controller 130 may determine a memory region including the concentrated cell region and the neighboring cell regions as the first normal cell region.

Figure 5:
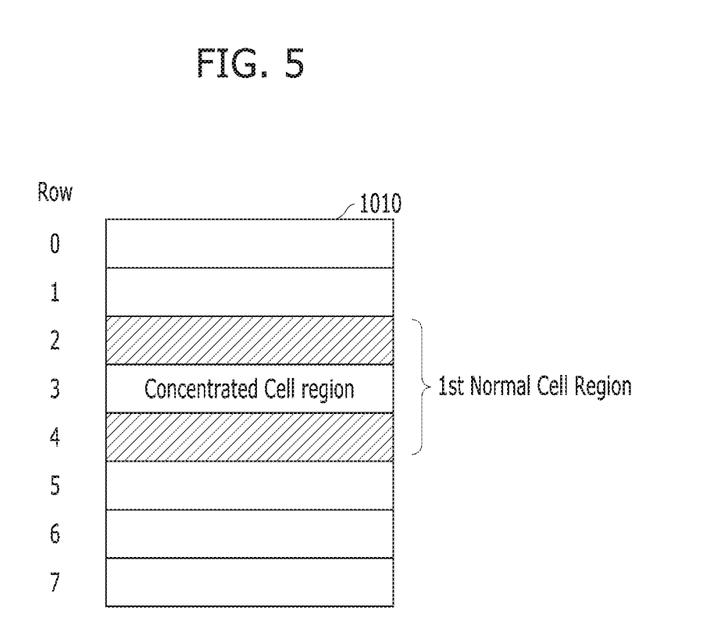
FIG. 5 schematically illustrates a memory cell array.

FIG. 5 is a diagram schematically illustrating a memory cell array 1010. Specifically, FIG. 5 illustrates neighboring cell regions corresponding to 2nd and 4th rows adjacent to a 3rd row corresponding to a concentrated cell region. In the example of FIG. 5, the controller 130 may determine, as the first (1st) normal cell region, a memory cell region corresponding to the 2nd to 4th rows, i.e., the concentrated cell region and the neighboring cell regions.

Referring back to FIG. 3, the controller 130 may perform the first address mapping to map the address of the first normal cell region to the address of the first spare cell region included in the spare memory regions 154a and 154b, in step S304.

Specifically, the controller 130 may determine, as the first spare cell region, a memory region having the same size as the first normal cell region among available memory regions of the spare memory regions 154a and 154b. The controller 130 may map the address of the first normal cell region to the address of the first spare cell region, and update the mapping table 174.

In an embodiment, the controller 130 may perform the first address mapping, and copy data stored in the first normal cell region into the first spare cell region.

In step S306, the controller 130 may detect whether the access count of the first spare cell region exceeds a second (2nd) threshold.

In an embodiment, the controller 130 may count the number of accesses to the memory cell region included in the spare memory regions 154a and 154b, and detect whether the access count of the first spare cell region exceeds the second threshold, based on the access count of the memory cell region.

In an embodiment, the number of accesses to the memory cell region may be counted for each row, and the access count for each row may be stored in the access count memory 172.

In an embodiment, the second threshold may be different for each of the spare memory regions 154a and 154b. For example, the second threshold may be changed depending on the type of memories constituting each of the spare memory regions 154a and 154b.

In an embodiment, the controller 130 may detect whether the access count of the first spare cell region exceeds the second threshold, in a set period, for example, whenever refresh is performed.

When it is detected that the access count of the first spare cell region exceeds the second threshold, the controller 130 may perform second address mapping to map the address of the first spare cell region to the address of the second normal cell region included in the normal memory regions 152a to 152d, in step S308.

The controller 130 may determine, as the second normal cell region, a memory region having the same size as the first spare cell region among available memory cell regions of the normal memory regions 152a to 152d. The controller 130 may map the address of the first spare cell region to the address of the second normal cell region, and update the mapping table 174.

In an embodiment, the second normal cell region may be the same as the first normal cell region. That is, the controller 130 may map the address of the first spare cell region to the address of the first normal cell region.

In an embodiment, the controller 130 may perform the second address mapping, and copy data stored in the first spare cell region into the second normal cell region.

In accordance with an embodiment, the memory system 110 may access the first spare cell region instead of the first normal cell region in which row hammering may occur, or access the second normal cell region instead of the first spare cell region in which row hammering may occur, thereby avoiding a data loss caused by the row hammering. Therefore, the reliability of the memory system 110 may be improved. Since the memory system 110 may not frequently perform refresh, the performance of the memory system 110 may also be maintained.

Figure 6:
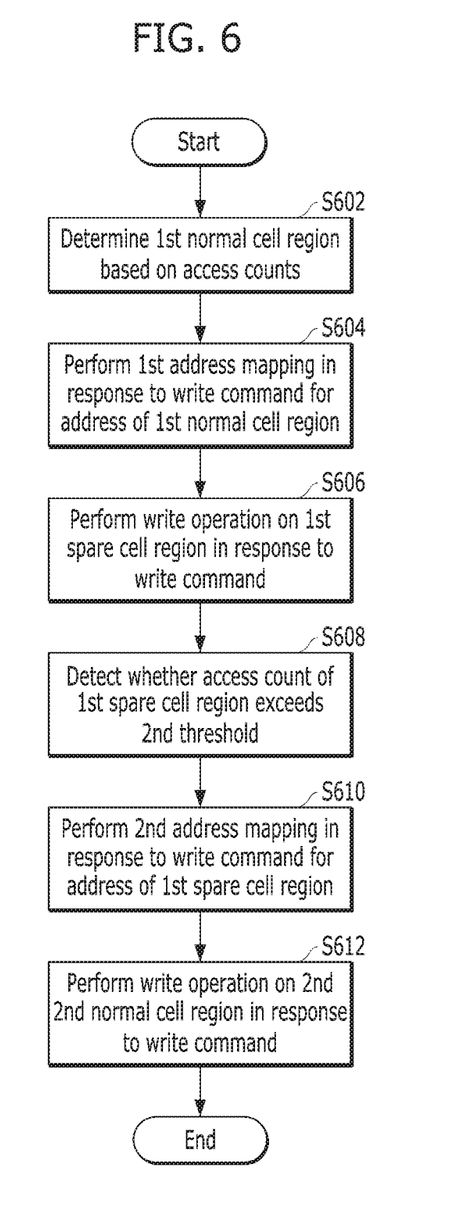
FIG. 6 is a flowchart illustrating an operation of a memory system in accordance with an embodiment of the present invention.

FIG. 6 is a flowchart illustrating an operation of the memory system 110 in accordance with an embodiment.

Referring to FIG. 6, in step S602, the controller 130 may decide the first normal cell region based on the access counts of the normal memory regions 152a to 152d. The method in which the controller 130 determines the first normal cell region has been described with reference to FIG. 4. The controller 130 may not perform first address mapping immediately after determining the first normal cell region.

In step S604, the controller 130 may perform the first address mapping to map the address of the first normal cell region to the address of the first spare cell region included in the spare memory regions 154a and 154b in response to a write command for the address of the first normal cell region. The write command may be received from the host 102 or generated inside the memory system 110.

In step S606, the controller 130 may perform a write operation on the 1st spare cell region in response to the write command.

That is, when the first normal cell region is determined and data stored in the first normal cell region are updated, the controller 130 may write the updated data to the first spare cell region while performing the first address mapping. After the updated data are written to the first spare cell region, the first normal cell region may still store the data which are not updated. However, when the controller 130 accesses the address of the first spare cell region after the first address mapping, the data of the first normal cell region, which are not updated, may not be accessed.

In step S608, the controller 130 may detect whether the access count of the first spare cell region exceeds the second threshold.

The controller 130 may not perform the second address mapping immediately after detecting whether the first spare cell region is intensively accessed.

In step S610, the controller 130 may perform the second address mapping to map the address of the first spare cell region to the address of the second normal cell region included in the normal memory regions 152a to 152d in response to a write command for the address of the first spare cell region.

In step S612, the controller 130 may perform a write operation on the second normal cell region in response to the write command.

Referring back to FIG. 2, the access frequencies of the normal memory regions 152a to 152d may be different from one another, depending on data stored therein. In this specification, a normal memory region which is accessed at a relatively high frequency may be defined as a hot memory region, and a normal memory region which is accessed at a relatively low frequency may be defined as a cold memory region.

In accordance with an embodiment, when a concentrated cell region is detected in a cold memory region, it may be considered that only the concentrated cell region is frequently accessed while the overall access frequency of the corresponding cold memory region is low. Therefore, the controller 130 may sufficiently maintain the reliability of data stored in the cold memory region by performing address mapping on only the concentrated cell region and neighboring cell regions having a relatively small size.

On the other hand, when a concentrated cell region is detected in a hot memory region, the controller 130 needs to perform address mapping on the concentrated cell region and neighboring cell regions having a relatively large size, because the neighboring cell regions as well as the concentrated cell region may be frequently accessed.

In an embodiment, the sizes of the first normal cell regions of the normal memory regions 152a to 152d may be determined according to the access counts of the respective normal memory regions 152a to 152d. For example, the sizes of the first normal cell regions of the normal memory regions 152a to 152d may be determined depending on whether each of the normal memory regions 152a to 152d is a hot memory region or cold memory region. An embodiment in which the sizes of the first normal cell regions of the normal memory regions 152a to 152d are determined according to the access counts of the respective normal memory regions 152a to 152d is described with reference to FIG. 7.

Figure 7:
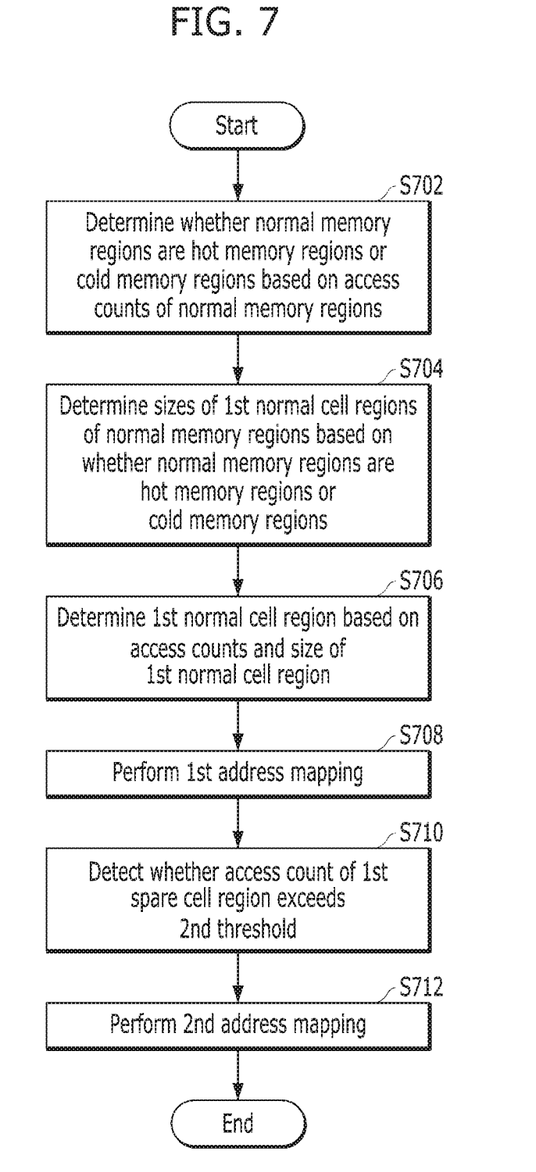
FIG. 7 is a flowchart illustrating an operation of a memory system in accordance with an embodiment of the present invention.

FIG. 7 is a flowchart illustrating an operation of the memory system 110 in accordance with an embodiment.

Referring to FIG. 7, in step S702, the controller 130 may decide whether each of the normal memory regions 152a to 152d is a hot memory region or cold memory region, based on the access counts of the respective normal memory regions 152a to 152d.

For example, the controller 130 may determine that a normal memory region whose access count exceeds a set threshold is a hot memory region, and a normal memory region whose access count does not exceed the threshold is a cold memory region.

In step S704, the controller 130 may determine the sizes of the first normal cell regions of the normal memory regions 152a to 152d, based on whether the normal memory regions 152a to 152d are hot memory regions or cold memory regions.

In an embodiment, the controller 130 may set the size of the first normal cell region of the hot memory region to a larger size than the size of the first normal cell region of the cold memory region.

In an embodiment, the controller 130 may determine the size of the first normal cell region by determining the sizes of the neighboring cell regions.

In step S706, the controller 130 may determine the first normal cell region based on the access counts of the normal memory regions 152a to 152d and the determined size of the first normal cell region.

Specifically, the controller 130 may detect a concentrated cell region whose access count exceeds the first threshold. When a normal cell region to which the concentrated cell region belongs is a hot memory region, for example, the controller 130 may determine relatively large memory regions around the concentrated cell region as the neighboring cell regions. The controller 130 may determine, as the first normal cell region, a memory region including the concentrated cell region and the relatively large neighboring cell regions.

In step S708, the controller 130 may perform the first address mapping to map the address of the first normal cell region to the address of the first spare cell region included in the spare memory regions 154*a* and 154*b*.

In an embodiment, the controller 130 may perform the first address mapping, and copy data stored in the first normal cell region into the first spare cell region.

In step S710, the controller 130 may detect whether the access count of the first spare cell region exceeds the second threshold.

When it is detected that the access count of the first spare cell region exceeds the second threshold, the controller 130 may perform second address mapping to map the address of the first spare cell region to the address of the second normal cell region included in the normal memory regions 152*a* to 152*d*, in step S712.

In an embodiment, the controller 130 may perform the second address mapping, and copy data stored in the first spare cell region into the second normal cell region.

In accordance with the present embodiment, the controller 130 may perform address mapping on the relatively large first normal cell region, for the hot memory region. Therefore, the controller 130 may avoid access to the relatively large first normal cell region where row hammering may occur, thereby improving the reliability of the memory system 110.

On the other hand, the controller 130 may perform address mapping on the relatively small first normal cell region, for the cold memory region. Therefore, the controller 130 may copy a relatively small amount of data into the first spare cell region, after the address mapping is performed. Therefore, the reliability of the memory system 110 may be maintained.

The memory system 110 described with reference to FIGS. 1 to 7 may be mounted as a memory board in a rack, and configure a server system or data processing system such as a data center. The data processing system including the memory system 110 in accordance with various embodiments is described below with reference to FIGS. 8 to 11.

Figure 8:
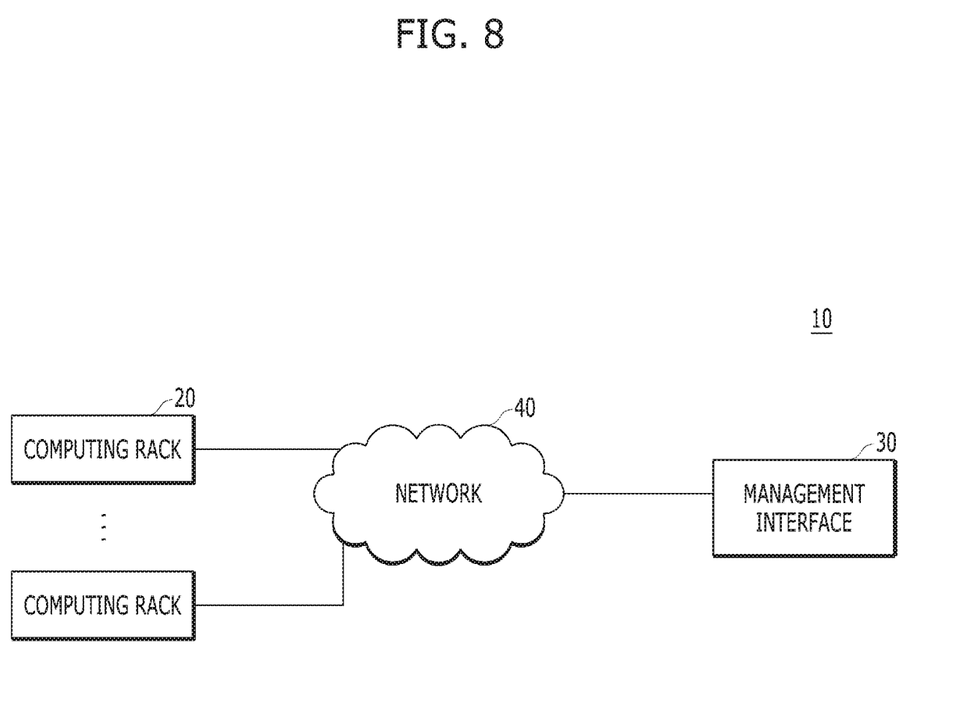
FIGS. 8 to 11 illustrate structures of data processing systems including a memory system in accordance with embodiments of the present invention.

FIG. 8 is a block diagram illustrating a data processing system 10.

Referring to FIG. 8, the data processing system 10 may include a plurality of computing racks 20, a management interface 30, and a network 40 for communication between the computing racks 20 and the management interface 30. The data processing system 10 having this rack scale architecture may be used by a data center for processing large-scale data.

Each of the computing racks 20 may individually implement one computing device. Alternatively, each of the computing racks 20 may be combined with one or more other computing racks to implement one computing device. Example structures and operations of the computing racks 20 are described below.

The management interface 30 may provide an interactive interface for a user to control, administrate, and/or manage the data processing system 10. The management interface 30 may be implemented as any type of a computing device that includes any of a computer, a multi-processor system, a server, a rack-mount server, a board server, a lap-top computer, a notebook computer, a tablet computer, a wearable computing device, a network device, a web device, a distributed computing system, a processor-based system, a consumer electronic device, and the like.

In some embodiments of the present disclosure, the management interface 30 may be implemented as a distributed system having operation functions which may be performed by the computing racks 20 or having user interface functions which may be performed by the management interface 30. In other embodiments of the present disclosure, the management interface 30 may be implemented as a virtual cloud server that includes multi-computing devices distributed through the network 40. The management interface 30 may include a processor, an input/output subsystem, a memory, a data storage device, a communication circuit, and the like.

The network 40 may send and/or receive data between the computing racks 20 and the management interface 30 and/or among the computing racks 20. The network 40 may be implemented with any of various wired and/or wireless networks. For example, the network 40 may include a publicly accessible global network, such as a wired or wireless local area network (LAN), a wide area network (WAN), a cellular network, and/or the Internet. In addition, the network 40 may include an appropriate number of auxiliary network devices, such as auxiliary computers, routers, switches, and the like.

Figure 9:
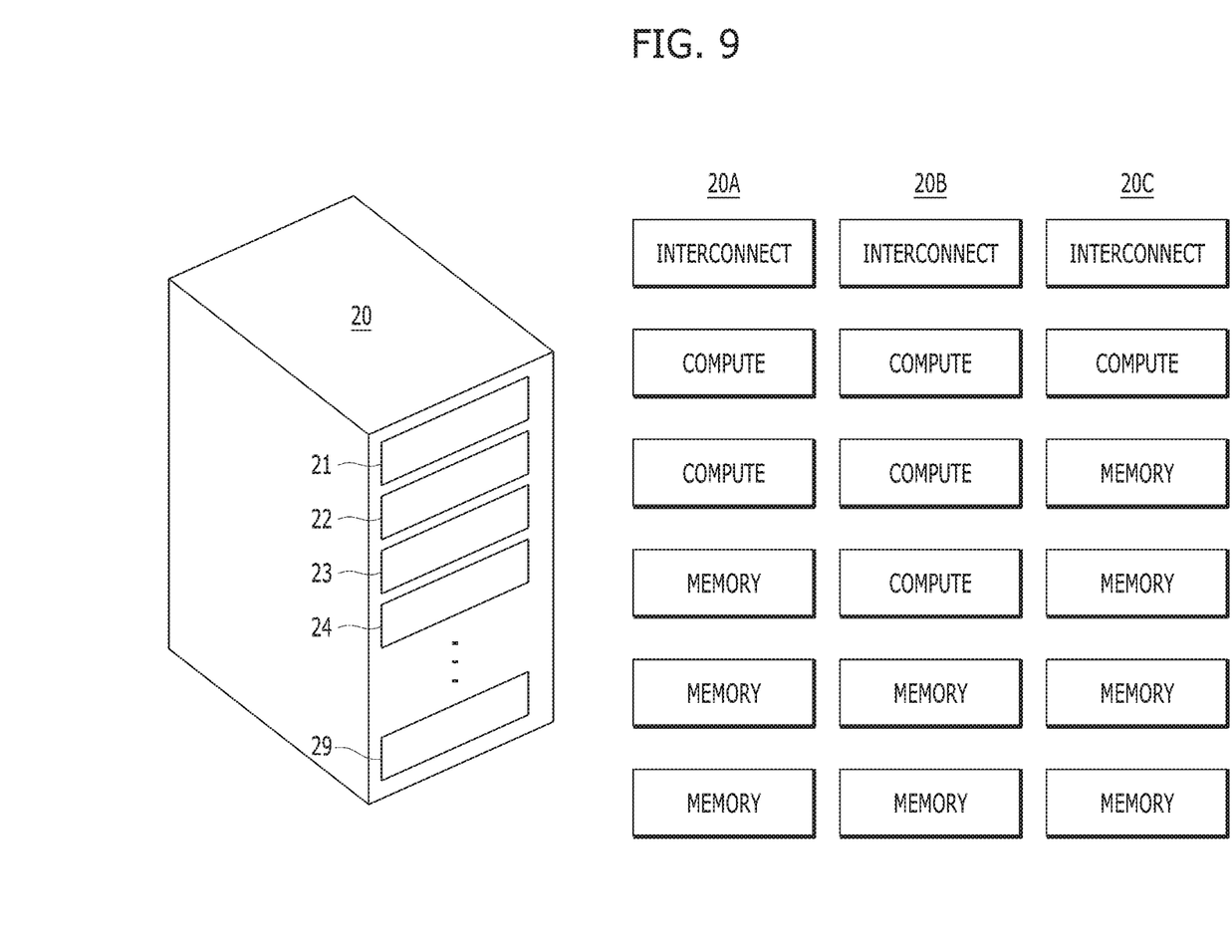

FIG. 9 illustrates an architecture of a computing rack 20 in accordance with an embodiment of the present disclosure.

Referring to FIG. 9, the computing rack 20 may include constituent elements in various forms and structures. For example, the computing rack 20 may include a plurality of drawers 21 to 29. Each of the drawers 21 to 29 may include a plurality of modules, each of which may include a plurality of boards.

In various embodiments of the present disclosure, the computing rack 20 may be implemented by a combination of appropriate numbers of compute boards, memory boards, and/or interconnect boards. The computing rack 20 is described as a combination of boards, but the computing rack 20 may also be implemented by other elements such as drawers, modules, trays, boards, sashes, or other suitable units. The computing rack 20 may have a structure in which its constituent elements are disaggregated and classified according to their functions. The computing rack 20 may have a structure of an interconnect board, a compute board, and a memory board with a classification order from the top down, although the computing rack 20 is not limited to such structure. The computing rack 20 and a computing device including the computing rack 20 may be referred to as 'a rack-scale system' or 'a disaggregated system.

In an embodiment of the present disclosure, a computing device may be implemented as one computing rack 20. In other embodiments, the computing device may be implemented by all or some constituent elements of two or more computing racks 20, or some constituent elements of one computing rack 20.

In various embodiments of the present disclosure, a computing device may be implemented by a combination of appropriate numbers of compute boards, memory boards, and interconnect boards that are included in the computing rack 20. As illustrated in FIG. 9, a computing rack 20A may include two compute boards, three memory boards, and one interconnect board. In other examples, a computing rack 20B may include three compute boards, two memory boards, and one interconnect board. In other examples, a computing rack 20C may include one compute board, four memory boards, and one interconnect board.

Although FIG. 9 illustrates examples in which the computing rack 20 includes appropriate numbers of compute boards, memory boards, and interconnect boards, the computing rack 20 may include additional constituent elements that may be included in typical servers, such as a power system, a cooling system, an input/output device, and the like.

Figure 10:
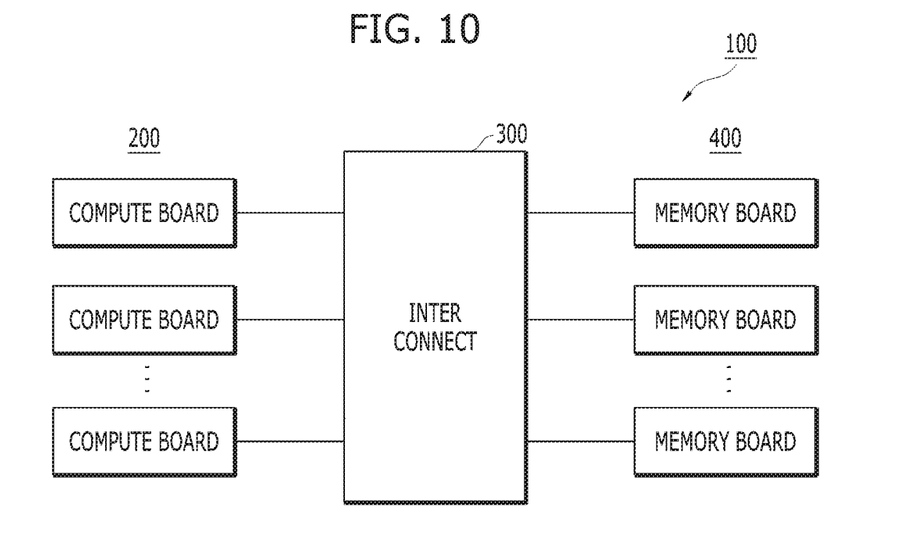

FIG. 10 illustrates a computing device 100 in accordance with an embodiment of the present disclosure.

Referring to FIG. 10, the computing device 100 may include a plurality of compute boards 200, a plurality of memory boards 400, and an interconnect board 300. The compute boards 200 may be pooled compute boards or pooled compute systems. The memory boards may be pooled memory boards or pooled memory systems. The computing device 100 is described as a combination of a plurality of boards, but the computing device 100 may also be implemented by elements such as drawers, modules, trays, boards, sashes, or other suitable units.

Each of the compute boards 200 may include processing elements such as one or more processors, processing/control circuits and central processing units (CPUs). The host 102 described with reference to FIG. 1 may correspond to the compute board 200.

Each of the memory boards 400 may include various types of memories such as a plurality of volatile memories and/or nonvolatile memories. For example, each of the memory boards 400 may include a plurality of dynamic random access memories (DRAMs), flash memories, memory cards, hard disk drives (HDDs), solid state drives (SSDs) and/or combinations thereof.

The memory system 110 described with reference to FIGS. 1 to 7 may correspond to each of the memory boards 400. Each of the memory boards 400 may include the controller 130 that performs the first and second address mappings in the normal memory regions 152a to 152d and the spare memory regions 154a and 154b, based on access counts.

Each of the memory boards 400 may be divided, allocated, or designated by and used by one or more processing elements that are included in each of the compute boards 200. Also, each of the memory boards 400 may store one or more operating systems (OS) that may be initialized and/or executed by the compute boards 200.

The interconnect board 300 may include a communication circuit, a communication device, or a combination thereof, which may be divided, allocated, or designated by and used by one or more processing elements included in each of the compute boards 200. For example, the interconnect board 300 may be implemented by any suitable number of network interface ports, interface cards, or interface switches. The interconnect board 300 may use protocols related to one or more wired communication technologies for communication. For example, the interconnect board 300 may support communication between the compute boards 200 and the memory boards 400 based on one or more of protocols such as peripheral component interconnect express (PCIe), QuickPath interconnect (QPI), Ethernet, and the like.

Figure 11:
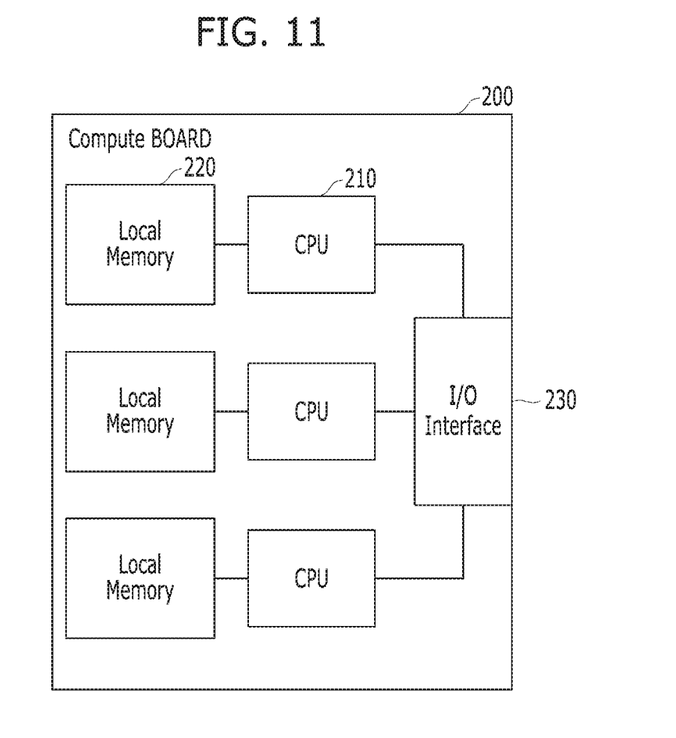

FIG. 11 is a block diagram illustrating a compute board 200 in accordance with an embodiment of the present disclosure.

Referring to FIG. 11, the compute board 200 may include one or more central processing units (CPUs) 210, one or more local memories 220, and an input/output (I/O) interface 230.

The CPUs 210 may divide, allocate, or designate one or more memory boards to be used, among the memory boards 400 illustrated in FIG. 7. Also, the CPUs 210 may initialize the one or more memory boards, and perform a data read operation and/or a data write (i.e., program) operation on the one or more memory boards.

The local memories 220 may store data to perform an operation of the CPUs 210. In various embodiments of the present disclosure, the local memories 220 may have a one-to-one correspondence with the CPUs 210.

The input/output interface 230 may support interfacing between the CPUs 210 and the memory boards 400 through the interconnect board 300 of FIG. 10. The input/output interface 230 may use protocols related to one or more wired communication technologies, output and provide data from the CPUs 210 to the interconnect board 300, and receive data inputted from the interconnect board 300 to the CPUs 210. For example, the input/output interface 230 may support communication between the CPUs 210 and the interconnect board 300 using one or more of protocols such as peripheral component interconnect express (PCIe), QuickPath interconnect (QPI), Ethernet and the like.

In accordance with various embodiments, it is possible to provide a memory system which determines data attributes by reflecting access counts of local addresses, respectively, and sorts and stores data having different attributes in a memory pool.

In accordance with various embodiments, it is possible to provide a method capable of preventing data distortion caused by row hammering while maintaining performance of a memory system, and the memory system.

Although various embodiments have been illustrated and described, it will be apparent to those skilled in the art in light of the present disclosure that various changes and modifications may be made without departing from the spirit and scope of the invention as defined in the following claims.

What is claimed is:

1. A memory system comprising:
one or more normal memory regions;
one or more spare memory regions; and
a controller suitable for controlling the normal memory regions and the spare memory regions,
wherein the controller determines, among the normal memory regions, a first normal cell region that includes a concentrated cell region whose access count exceeds a first threshold and neighboring cell regions in a set range from the concentrated cell region, performs first address mapping to map an address of the first normal cell region to an address of a first spare cell region in the spare memory regions, and performs second address mapping to map the address of the first spare cell region to an address of a second normal cell region in the normal memory regions, when an access count of the first spare cell region exceeds a second threshold.

2. The memory system of claim 1, wherein the controller performs the first address mapping and performs a write operation on the first spare cell region, in response to a write command for the address of the first normal cell region.

3. The memory system of claim 1, wherein the second normal cell region is the same as the first normal cell region.

4. The memory system of claim 1, wherein the first threshold is determined individually for each of the normal memory regions.

5. The memory system of claim 1, wherein the controller performs the second address mapping and performs a write operation on the second normal cell region, in response to a write command for the address of the first spare cell region.

6. The memory system of claim 5, wherein the second threshold is determined individually for each of the spare memory regions.

7. The memory system of claim 1, wherein the controller determines that each of the normal memory regions is a hot memory region or a cold memory region, based on access counts of the respective normal memory regions, and sets the size of the first normal cell region depending on whether it is determined to be a hot memory region or a cold memory region.

8. The memory system of claim 7, wherein the controller sets the size of the first normal cell region to a larger size than when the first normal cell region is determined to be a hot memory region, as compared to when the first normal cell region is determined to be a cold memory region.

9. The memory system of claim 1, wherein the controller copies data stored in the first normal cell region into the first spare cell region after the first address mapping, and copies data stored in the first spare cell region into the second normal cell region after the second address mapping.

10. An operating method of a memory system which includes one or more normal memory regions and one or more spare memory regions, the operating method comprising:
   determining, among the normal memory regions, a first normal cell region that includes a concentrated cell region whose access count exceeds a first threshold and neighboring cell regions in a set range from the concentrated cell region;
   performing first address mapping to map an address of the first normal cell region to an address of a first spare cell region in the spare memory regions; and
   performing second address mapping to map the address of the first spare cell region to an address of a second normal cell region in the normal memory regions, when an access count of the first spare cell region exceeds a second threshold.

11. The operating method of claim 10, wherein the first address mapping is performed in response to a write command for the address of the first normal cell region,
   wherein the method further comprises performing a write operation on the first spare cell region in response to the write command.

12. The operating method of claim 10, wherein the performing of the second address mapping comprises mapping the address of the first spare cell region to the address of the second normal cell region which is the same as the first normal cell region.

13. The operating method of claim 10, wherein the first threshold is determined individually for each of the normal memory regions.

14. The operating method of claim 10, wherein the second address mapping is performed in response to a write command for the address of the first spare cell region,
   wherein the method further comprises performing a write operation on the second normal cell region in response to the write command.

15. The operating method of claim 14, wherein the second threshold is determined individually for each of the spare memory regions.

16. The operating method of claim 10, further comprising:
   determining whether each of the normal memory regions is a hot memory region or a cold memory region, based on access counts of the respective normal memory regions; and
   setting the size of the first normal cell region, depending on whether it is determined to be a hot memory region or a cold memory region.

17. The operating method of claim 16, wherein the setting of the size of the first normal cell region comprises setting the size of the first normal cell region to a larger size than when the first normal cell region is determined to be a hot memory region, as compared to when the first normal cell region is determined to be a cold memory region.

18. The operating method of claim 10, further comprising:
   copying data stored in the first normal cell region into the first spare cell region, after the performing of the first address mapping; and
   copying data stored in the first spare cell region into the second normal cell region, after the performing of the second address mapping.

* * * * *